United States Patent
Li et al.

(10) Patent No.: US 6,835,279 B2
(45) Date of Patent: Dec. 28, 2004

(54) PLASMA GENERATION APPARATUS

(75) Inventors: Yunlong Li, Tokyo (JP); Noriyoshi Sato, 4-7-113, Kadan, Aoba-Ku, Sendai 980-0815, Miyagi-Ken (JP); Satoru Iizuka, Sendai (JP)

(73) Assignees: Hitachi Kokusai Electric Inc., Tokyo (JP); Noriyoshi Sato, Sendai (JP)

( * ) Notice: Subject to any disclaimer, the term of this patent is extended or adjusted under 35 U.S.C. 154(b) by 0 days.

(21) Appl. No.: 09/123,352

(22) Filed: Jul. 28, 1998

(65) Prior Publication Data

US 2003/0127191 A1 Jul. 10, 2003

(30) Foreign Application Priority Data

Jul. 30, 1997 (JP) ............................... 9-204480

(51) Int. Cl.$^7$ ........................... H05H 1/00; C23C 16/00
(52) U.S. Cl. ............................ 156/345.46; 118/723 E
(58) Field of Search ........................... 156/643.1, 345; 204/298.37, 345; 364/556; 304/192.15; 315/111.21, 111.81; 427/38, 553; 118/723 E

(56) References Cited

U.S. PATENT DOCUMENTS

| | | | | |
|---|---|---|---|---|
| 4,572,759 A | * | 2/1986 | Benzing | 156/345 |
| 4,624,767 A | * | 11/1986 | Obinata | 204/298 |
| 4,894,254 A | * | 1/1990 | Nakayama et al. | 427/38 |
| 4,950,956 A | * | 8/1990 | Asamaki et al. | 315/111.21 |
| 5,017,835 A | * | 5/1991 | Oechsner | 315/111.81 |
| 5,073,241 A | * | 12/1991 | Wantanabe | 204/192.15 |
| 5,362,358 A | * | 11/1994 | Yamagata et al. | 156/345.42 |
| 5,431,769 A | * | 7/1995 | Kisakibaru et al. | 156/345 |
| 5,444,637 A | * | 8/1995 | Smesny et al. | 364/556 |
| 5,587,205 A | * | 12/1996 | Saito et al. | 427/553 |
| 5,589,737 A | * | 12/1996 | Barnes et al. | 315/111.21 |
| 5,595,627 A | * | 1/1997 | Inazawa et al. | 156/643.1 |
| 5,605,576 A | * | 2/1997 | Sasaki et al. | 118/723 E |
| 5,653,851 A | * | 8/1997 | Shelton | 216/67 |
| 5,656,123 A | * | 8/1997 | Salimian et al. | 156/345.43 |
| 5,795,452 A | * | 8/1998 | Kinoshita et al. | 204/298.37 |
| 5,980,687 A | * | 11/1999 | Koshimizu | 156/345.29 |
| 6,095,084 A | * | 8/2000 | Shamouilian et al. | 118/723 E |

FOREIGN PATENT DOCUMENTS

JP        7201831        8/1995

OTHER PUBLICATIONS

Computer Translation from http://www6.ipdl.jpo.go.jp/Tokujitu/PAJdetail.ipdl!N0000=60&N0120=01&N2001=2&N3001=H07–201831.*

(List continued on next page.)

Primary Examiner—Parviz Hassanzadeh
(74) Attorney, Agent, or Firm—Antonelli, Terry, Stout & Kraus, LLP

(57) ABSTRACT

The object of the present invention is to make possible generation of high-density plasma even in the center of a plasma generation region. A plasma generation apparatus comprises a vacuum vessel 11, gas induction unit 12, exhaust unit 13, cylindrical discharge electrode 14, high-frequency oscillators 19 and 21, ring-shaped permanent magnets 15 and 16, and two disk-shaped walls 17 and 18. The discharge electrode 14 is fashioned so as to enclose a plasma generation region 41. The permanent magnets 15 and 16 form prescribed magnetic force lines. These magnetic force lines have portions that are roughly parallel to the center axis 42 of the discharge electrode 14, the lengths of which parallel portions become longer as the magnetic force lines approach the center axis 42. The two walls 17 and 18 define the scope of the plasma generation region 41 in the dimension of the center axis 42 of the discharge electrode 14. These two walls 17 and 18 are positioned so as to sandwich therebetween the plasma generation region 41 in the dimension of the center axis 42. The plasma generation apparatus is also configured so that the magnetic force lines 43 passing through the center of the plasma generation 41 are shaped so that they do not intersect the two walls 17 and 18.

15 Claims, 10 Drawing Sheets

OTHER PUBLICATIONS

Y. Li, et al "Plasma–density Control in the Magnetron–type RF Plasma", Plasma Sources Sci. Technology 5 (1996) pp. 241–244.

Y. Li, et al "Plasma Structure in a Modified Magnetrontyped RF Discharge", Proceedings of the $13^{th}$ Symposium on Plasma Processing, Tokyo, Japan, 1996, pp. 53–56.

Y. Li, et al "Production of 1–m–Size Uniform Plasma by Modified Magnetron–Typed RF Discharge", SPSM–10, Tokyo, 1997.

Y. Li, et al, "Electron Temperature Control in Large–Diameter Radio–Frequency Plasma", Proceedings of the $3^{rd}$ Asia-Pacific Conference on Plasma Science & Technology, Tokyo, Japan, 1996, pp. 435–439.

S. Wickramanayaka, et al, "Variation of Radial Plasma Density Profile with the Excitation Frequency in a Magnetron–type Plasma", J. Appl. Phys. vol. 37, 1998, pp. 2035–2038.

N. Sato, et a; "Sputtering Control in a Modified RF Plasma", Proceedings of the International Workshop on Basic Aspects of Nonequilibium Plasmas Interacting with Surfaces, Shirahama, Japan, 1997, pp. 27–28.

* cited by examiner

FIG.9

| APPARATUS<br>ITEM | FIG.1 | FIG.4 | FIG.6 | FIG.10 |
|---|---|---|---|---|
| PLASM GENERATION EFFICIENCY (EFFECTING HIGHER PLASMA DENSITY) | ◉ | ○ | △ | △ |
| PLASM DENSITY DISTRIBUTION CONTROLLABILITY (DIFFICULTY OF ACHIEVING UNIFORM DENSITY DISTRIBUTION) | ◉ | ○ | / | / |
| LARGER CALIBER APPARATUSES (ABILITY TO HANDLE LARGE-DIAMETER SUBSTRATES) | ◉ | ○ | △ | △ |
| APPARATUS COST | ○ | ◉ | ◉ | ◉ |

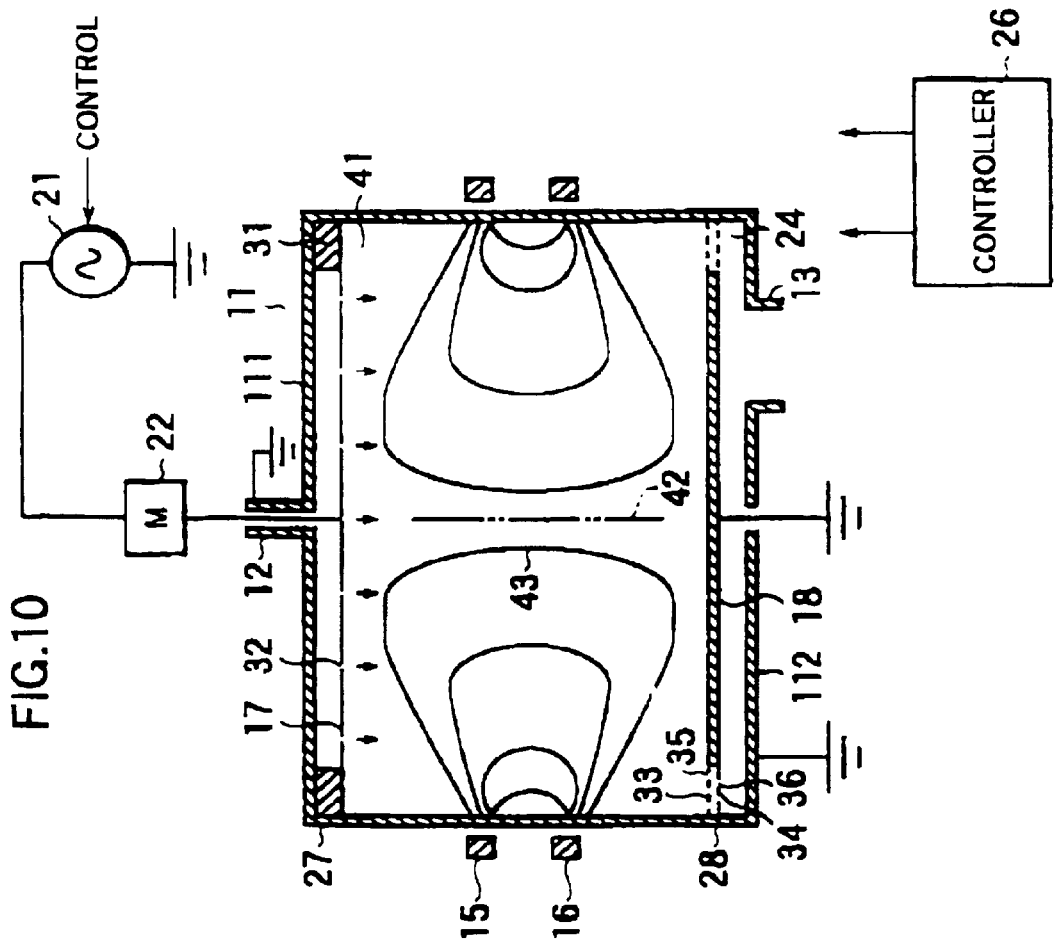

PLASMA GENERATION APPARATUS

BACKGROUND OF THE INVENTION

1. Field of the Invention

This invention concerns a modified magnetron high-frequency discharge type plasma generation apparatus.

2. Description of the Related Art

In general, in order to fabricate a solid device, it is necessary to employ a surface treatment apparatus for subjecting the surface of the substrate of the solid device to some prescribed treatment. By solid device here is meant, for example, any semiconductor device or liquid crystal display device, etc. And by the substrate of the solid device is meant a substrate such as a wafer for a semiconductor device or glass plate for a liquid crystal display device.

Such surface treatment apparatuses include dry etching apparatuses and CVD (chemical vapor deposition) devices, and so on. By dry etching apparatus here is meant an apparatus for dry-etching the surface of a substrate. And by CVD apparatus is meant an apparatus for using a chemical reaction to form a prescribed thin film on the surface of a substrate.

Among these surface treatment apparatuses are plasma surface treatment apparatuses which use plasma to effect prescribed treatments on substrate surfaces. In order to implement such a plasma surface treatment apparatus, it is necessary to have a plasma generation apparatus for generating plasma.

In recent years, a demand has risen for plasma generation apparatuses which can generate plasma under conditions of low discharge gas pressure, reflecting the trend toward greater solid device miniaturization.

More specifically, when a solid device is further miniaturized, greater precision in the direction of ion incidence on the substrate is demanded. This incidence direction precision depends on the pressure of the discharge gas. That is, when the gas pressure is low, the incidence direction precision is higher, and when that pressure is high, the precision is lower. This is because, when the gas pressure is high, as the ions in the plasma impact the substrate while being accelerated by the sheath voltage on the surface of the substrate, they collide with neutral gas before reaching the surface. Thus it is necessary to generate plasma at low gas pressures to cope with further miniaturization in solid devices.

By low gas pressure, furthermore, although this will differ according to the type of surface treatment involved, is generally meant a pressure of 30 m Torr or less. By way of comparison, when a semiconductor device wafer is subjected to dry etching, the plasma should be generated with a gas pressure of about 10 m Torr.

The magnetron high-frequency discharge type of plasma generation apparatus has been known for some time as a plasma generation apparatus capable of generating plasma at low gas pressures. This apparatus generates plasma by magnetron discharges using a high-frequency electric field.

An example of such a plasma generation apparatus is described in the literature cited below.

Reference: Unexamined Patent Application [Tokkai] No. H7-201831 [1995].

The plasma generation apparatus described in the cited literature is fashioned so that it generates plasma by generating magnetron discharges by a high-frequency electric field formed by a cylindrical discharge electrode and a magnetic field formed by ring-shaped permanent magnets.

With the plasma generation apparatus described in the cited patent application, however, there is a problem in that high-density plasma cannot be generated in the center of the plasma generation region. This is due to fact that, in this plasma generation apparatus, plasma is mainly generated at the surface of the discharge electrode. By center of the plasma generation region here is meant the center in the radial dimension of the discharge electrode (and so hereinafter).

Thus, with this plasma generation apparatus, when a plasma surface-treatment apparatus is implemented, there is a problem in that surface treatment cannot be performed under uniform plasma density conditions.

In order to resolve this problem, it is only necessary to install the susceptor in a location that is considerably removed from the discharge electrode in the axial direction thereof. By susceptor here is meant a substrate carrier on which the substrates being processed are carried.

With such a configuration as this, however, although it is possible to perform surface treatment under uniform plasma density conditions, it is not possible to perform surface treatment under conditions of high plasma density, which constitutes a new problem. This is due to the fact that, in a plasma generation apparatus such as that described above, as the distance from the discharge electrode increases in the axial direction, plasma density declines due to plasma diffusion loss. As a consequence, with such a configuration as this, de surface treatment processing speed becomes slow.

In view of the foregoing, there is a need for a modified magnetron high-frequency type of plasma generation apparatus that can generate high-density plasma in the center of the discharge electrode as well as at the periphery. By periphery of the plasma generation apparatus here is meant the peripheral region in the radical dimension of the discharge electrode (and so hereinafter).

SUMMARY OF THE INVENTION

Thereupon, an object of the present invention is to provide a modified magnetron high-frequency discharge type plasma generation apparatus capable of generating high-density plasma in the center of the plasma generation region as well as at the periphery.

The plasma generation apparatus for the purpose of resolving the problem noted above, comprises a vacuum vessel, gas induction means, exhaust means, discharge electrode, first high-frequency electric power application means, magnetic force line formation means, and two walls.

The vacuum vessel is a vessel in the interior of which is established a plasma generation region. The gas induction means are means for inducting discharge gas into the interior of the vacuum vessel. The exhaust means are means for exhausting the atmosphere in the interior of the vacuum vessel. The discharge electrode is an electrode positioned so as to enclose the plasma generation region. This electrode is formed in a cylindrical shape.

The first high-frequency electric power application means are means for applying high-frequency electric power to the discharge electrode. The magnetic force line generation means are means for forming prescribed lines of magnetic force. These magnetic force lines have portions that roughly parallel the discharge electrode center axis, the length of these parallel portions becoming longer the closer they are to the center axis. The two walls are walls that define the scope of the plasma generation region in the dimension of the discharge electrode center axis. These two walls are positioned so as to sandwich the plasma generation region between them in the dimension of the center axis of the discharge electrode.

The plasma generation apparatus moreover, is characteristic in that it is configured so that the magnetic force lines that pass through the center of the plasma generation region are shaped so that they do not intersect the two walls.

These magnetic force lines are formed, for example, by suitably setting the size of the vacuum vessel, the position and configuration of the magnetic force lines forming means, and the position of and interval between the two walls, etc.

With the plasma generation apparatus when plasma is generated, discharge gas is inducted by the gas induction means into the interior of the vacuum vessel. When is done, furthermore, the atmosphere in the interior of the vacuum vessel is exhausted by the exhaust means. Thus the interior of the vacuum vessel is established in a condition of reduced pressure. In this case, moreover, high-frequency electric power is applied to the discharge electrode. Thus is formed a high-frequency electric field component oriented in the radical direction of the discharge electrode. And, furthermore, magnetic force lines having portions roughly parallel to the center axis of the discharge electrode are formed by the magnetic force lines forming means. Thus are formed a high-frequency electric field and magnetic field that are mutually perpendicular in the plasma generation region. As a consequence, the electrons emitted by the discharge electrode exhibit magnetron motion. This magnetron motion generates magnetron discharges. Plasma is generated by the magnetron discharges.

With this apparatus, configured in this way, the magnetic force lines that pass through the center of the plasma generation region are established having a shape wherewith they do not intersect the two walls. Thus the outflow of high-energy electrons can be suppressed in the center of the plasma generation region.

By high-energy electron outflow here is meant the flowing out, through the walls, of high-energy electrons trapped by the magnetic force lines. This outflow occurs irrespective of the material of which the two walls are made. That being so, this outflow is determined by the difference between the surface potential on the two walls and the plasma space potential, and by the positional relationship between the two walls and the magnetic force lines formed in the plasma generation region.

By means of this suppression, magnetron discharge generation efficiency can be enhanced in the center of the plasma generation region just as at the periphery. Thus plasma generation efficiency is enhanced in the center of the plasma generation region as at the periphery thereof. As a consequence, high-density plasma can be generated in the center of the plasma generation region just as in the periphery.

The plasma generation apparatus wherein the two walls are formed of a material exhibiting electrical conductivity.

With the plasma generation apparatus described above and the two walls are formed of a material exhibiting electrical conductivity, it is possible, using these walls, to electrically control the density of the plasma.

The plasma generation apparatus as described above further includes second high-frequency electric power application means for applying high-frequency electric power to one of the two walls.

With the plasma generation apparatus as described above, wherein high-frequency electric power is applied by the second high-frequency electric power application means to one of the two walls. Thus a high-frequency electric field is formed in the center axial dimension of the discharge electrode. As a consequence, the high-energy electrons trapped by the magnetic force lines exhibit high-frequency oscillation in the direction of the center axis of the discharge electrode. This high-frequency oscillation generates discharges (hereinafter called "high-frequency oscillation discharges") that differ from the magnetron discharges. As a result, plasma generation efficiency is enhanced.

The high-frequency oscillation discharge generation efficiency rises higher in the center of the plasma generation region than at the periphery. This is so because, in the magnetic force lines, the portions thereof parallel to the discharge electrode center axis become longer the closer they are to the center axis. Thus plasma generation efficiency in the center of the plasma generation region is enhanced.

The plasma generation apparatus as described above, wherein the other of the two walls is connected to a reference potential point.

With the, plasma generation apparatus and the other two walls is connected to the reference potential point, the average plasma space potential can be made low. As a result, it is possible to reduce contamination by metal from the other electrode surface connected to the reference potential point.

The plasma generation as described above, wherein the other of the two walls is established in an electrically floating state.

With the plasma generation apparatus as described above, the other of the two walls is established in an electrically floating state. Thus it is possible to reduce the damage done in the other of the two walls by the sheath voltage. The plasma generation apparatus as described above, wherein the other of the two walls is use holder for holding the object being treated when that object being treated is subjected to a prescribed treatment.

With the plasma generation apparatus as described above, it is possible to lower the sheath voltage in the surface of the object being treated that is being held by the other of the two walls. Thus it is possible to reduce the damage done to the object being treated by the sheath voltage.

The plasma generation apparatus as described above, wherein the first-frequency electric power application means comprises a first high-frequency electric power supply for outputting the high-frequency electric power applied to the discharge electrode. Moreover, the second high-frequency electric power application means comprises a second high-frequency power supply for outputting the high-frequency electric power that is applied to one of the two walls by the second high-frequency electric power application means.

With the plasma generation apparatus as described above, the high-frequency electric power applied to the discharge electrode is output from the first high-frequency electric power supply. On the contrary, the high-frequency electric power applied to one of the two walls is output from the second high-frequency electric power supply. Thus the magnitude of the high-frequency electric power applied to the discharge electrode and the magnitude of the high-frequency electric power applied to one of the two walls can be set independently. As a consequence, the density of the plasma generated by the magnetron discharges and the density of the plasma generated by the high-frequency oscillation discharges can be set independently. Thus it is possible to establish the density distribution of the plasma in the radial dimension of the discharge electrode as a uniform density distribution.

The plasma generation apparatus as described above, wherein the first high-frequency electric power application means comprises high-frequency electric power supply for outputting the high-frequency electric power applied to the discharge electrode. In this apparatus, moreover, the second high-frequency electric power application means comprises a high-frequency resonant circuit that resonates with the high-frequency electric power output by the high-frequency electric power supply.

With the plasma generation apparatus, the high-frequency electric power applied to the discharge electrode is provided by the high-frequency electric power supply. On the contrary, the high-frequency electric power applied to one of the two walls is provided from the high-frequency power supply via the high-frequency resonant circuit. Thus the number of high-frequency electric power supplies can be limited to one. As a consequence, it is possible both to keep the apparatus circuit configuration simple and to reduce manufacturing costs.

The plasma generation apparatus as described above both of the two walls are connected to the reference potential point.

In the plasma generation apparatus described both of the two walls are connected to the reference potential point. This makes it possible to lower the average plasma apace potential even further. As a result, contamination by metal from the surface of the electrode connected to the reference potential point can be suppressed to a bare minimum. The plasma generation apparatus as described above, further includes control means for controlling the magnitude of the high-frequency electric power applied by the first high-frequency electric power application means to the discharge electrode.

With the plasma generation apparatus as described above the magnitude of the high-frequency electric power applied to the discharge electrode is controlled by the control means. Thus the density of the plasma generated by the magnetron discharges can be controlled.

The plasma generation apparatus as described above, further includes control means for controlling the high-frequency electric power output by the first and second high-frequency electric power supplies.

With the plasma generation apparatus as described above the magnitude of the high-frequency electric power applied to the discharge electrode and the magnitude of the high-frequency electric power applied to one of the two walls are controlled by the control means. Thus the density of the plasma generated by the magnetron discharges and the density of the plasma generated by the high-frequency oscillation discharges can be controlled. An a consequence, the density distribution of the plasma in the radial dimension of the discharge electrode can be controlled. The plasma generation apparatus as described above, wherein the control means are configured so that, when controlling the magnitudes of the high-frequency electric power output by the first and second high-frequency electric power supplies, both magnitudes are controlled such that the ratio between them is always a predetermined value.

With the plasma generation apparatus as described above the magnitudes of the high-frequency electric power output from the first and second high-frequency electric power supplies are continually controlled so that the ratio between the two magnitudes is a predetermined value. Thus, when controlling the plasma density, that control can be effected while continually maintaining the prescribed plasma density distribution in the radial dimension of the discharge electrode. Also, by designating the magnitude of the high-frequency electric power output from either one of the first and second high-frequency electric power supplies, the magnitude of the high-frequency electric power output from the other is automatically corrected. Thus the operator work load when controlling the magnitude of the high-frequency electric power can be reduced. The plasma generation apparatus as described above, further comprising control means for controlling the magnitude of the high-frequency electric power output by the high-frequency power supply.

With the plasma generation apparatus as described above by controlling the magnitude of the high-frequency electric power output by the high-frequency electric power supply, the magnitude of the high-frequency electric power applied to the discharge electrode is controlled. At the same time, furthermore, the magnitude of the high-frequency electric power applied to one of the two walls is also controlled. Thus the operator work load when controlling the magnitude of the high-frequency electric power can be reduced. The plasma generation apparatus as described above, further includes position adjustment means for adjusting the positions of the two walls in the center axial dimension of the discharge electrode.

With the plasma generation apparatus as described above the positions of the two walls in the center axial dimension of the discharge electrode can be adjusted. Thus, after the apparatus has been assembled, magnetic force lines can be formed that do not intersect the two walls. As a consequence, the formation of such magnetic force lines is made easy.

The plasma generation apparatus as described above, wherein one of the two walls is used as a gas diffusion plate for diffusing the discharge gas in the plasma generation region. In this apparatus, furthermore, the other of the two walls is used as a holder for holding the object being treated when subjecting that object being treated to a prescribed treatment using the plasma.

With the plasma generation apparatus as described above the discharge gas inducted by the gas induction means is dispersed in the plasma generation region by one of the two walls. Thus the discharge gas is supplied uniformly throughout the plasma generation region. With this apparatus, furthermore, when the plasma is used to perform a prescribed treatment on an object being treated, that object being treated is held by the other of the two walls. Thus a plasma treatment apparatus can easily be configured from the plasma generation apparatus.

The plasma generation apparatus as described above, includes a vacuum vessel, gas induction means, exhaust means, discharge electrode, first high-frequency electric power application means, magnetic force line formation means, two walls, and second high-frequency electric power application means.

Here the vacuum vessel is a vessel having a plasma generation region established in its interior. The gas induction means are means for inducting the discharge gas into the interior of the vacuum vessel. The exhaust means are means for exhausting the atmosphere in the interior of the vacuum vessel. The discharge electrode is an electrode deployed so as to enclose the plasma generation region. This electrode is formed in a cylindrical shape. The first high-frequency electric power application means are means for applying high-frequency electric power to the discharge electrode. The magnetic force line formation means are means for forming magnetic force lines in the plasma generation region. The two walls are walls that define the scope of the plasma generation region in the center axial dimension of the discharge electrode. These two walls are formed of a material exhibiting electrical conductivity, and are deployed so as to sandwich the plasma generation region between them in the center axial dimension of the discharge electrode. The second high-frequency electric power application means are means for applying high-frequency electric power to one of the two walls.

With the plasma generation apparatus as described above when generating plasma, discharge gas is inducted into the interior of the vacuum vessel by the gas induction means. When this is done, the atmosphere in the interior of the vacuum vessel is exhausted by the exhaust means. Thus the interior of the vacuum vessel is established in a reduced pressure state. When this is done, moreover, high-frequency electric power is applied to the discharge electrode. Thus a high-frequency field is formed that is oriented in the radial direction of the discharge electrode. In addition, when this is so, magnetic force lines are formed in the plasma generation region by the magnetic force line formation means. Thus the electrons exhibit magnetron motion. As a result of this magnetron motion, magnetron discharges are generated. As a result of these magnetron discharges, plasma is generated.

In this case, high-frequency electric power is supplied to one of the two walls. As a result, a high-frequency electric field is formed facing in the center axial direction of the discharge electrode. As a consequence, high-energy electrons trapped by the magnetic force lines exhibit high-frequency oscillation. As a result, discharges are generated that differ from the magnetron discharges. As a consequence, plasma generation efficiency can be raised higher than it can be with magnetron discharges only.

Comprehended in this apparatus, moreover, are cases wherein there are no magnetic force lines which do not intersect with the two walls. In such cases, the number of high-energy electrons trapped in the magnetic force lines becomes small. As a result, the efficiency of plasma generation by magnetron discharge deteriorates. With this apparatus, however, high-frequency oscillation discharges are obtained. As a result, the decline in the efficiency of plasma generation by magnetron discharge is compensated for.

BRIEF DESCRIPTION OF THE DRAWINGS

FIG. 9 is a table in which the performance of multiple plasma generation apparatuses is compared;

FIG. 10 is a lateral cross-sectional diagram of a plasma generation apparatus that does not employ magnetron discharges.

DESCRIPTION OF THE PREFERRED EMBODIMENTS

Detailed descriptions of embodiments of the present invention are now given, making reference to the drawings.

A first embodiment is described first, beginning with the configuration thereof.

Figure 1:
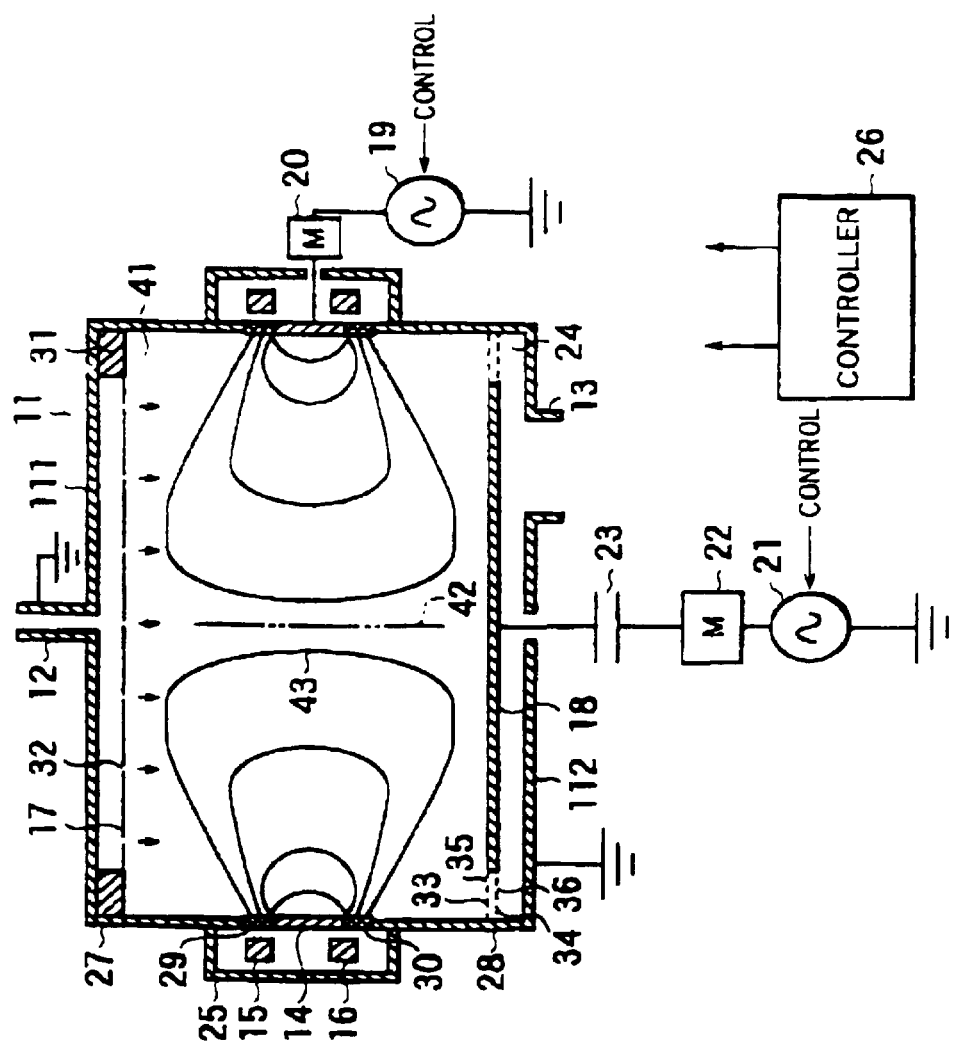
FIG. 1 is a lateral cross-sectional diagram of a first embodiment of the present invention.

FIG. 1 is a lateral cross-sectional diagram of the first embodiment of the present invention.

The plasma generation apparatus in this embodiment comprises a vacuum vessel 11, gas induction unit 12, exhaust unit 13, discharge electrode 14, two permanent magnets 15 and 16, two walls 17 and 18, a first high-frequency oscillator 19, a first matching circuit 20, a second high-frequency oscillator 21, a second matching circuit 22, a blocking capacitor 23, a high-frequency shielding unit 24, a high-frequency shielding cover 25, and a controller 26.

Here, the vacuum vessel 11 is a vessel having a plasma generation region 41 formed in its interior. In other words, this is a vessel that provides a sealed plasma generation space. The gas induction unit 12 is a part for inducting discharge gas into the interior of the vacuum vessel 11. The exhaust unit 13 is a part for exhausting the atmosphere in the interior of the vacuum vessel 11.

The discharge electrode 14 is an electron for forming a high-frequency electric field for magnetron discharges. The permanent magnets 15 and 16 are magnets for forming magnetic force lines 43 for magnetron discharges. The two walls 17 and 18 are walls for defining the scope of the plasma generation region 41 in the direction of the center axis 42 of the discharge electrode 14. These walls 17 and 18 are formed of an electrically conducting material. In this case, for example, the lower wall 18 is used as an electrode for forming a high-frequency electric field for the high-frequency oscillation discharges. Hereinafter, the upper wall 17 is called the top wall 17, and the lower wall 18 is called the bottom wall 18.

The first high-frequency oscillator 19 is an oscillator that outputs high-frequency electric power for the magnetron discharges. This high-frequency oscillator 19 is, for example, connected via the first matching circuit 20 to the discharge electrode 14. The matching circuit 20, here, is a circuit for matching the first high-frequency oscillator 19 with the discharge electrode 14.

The second high-frequency oscillator 21 is an oscillator that outputs high-frequency electric power for the high-frequency oscillation discharges. This high-frequency oscillator 21 is, for example, connected to one or other of the two walls 17 and 18, for example to the bottom wall 18, via the second matching circuit 22 and the blocking capacitor 23. The matching circuit 22, here, is a circuit for matching the second high-frequency oscillator 21 and the bottom wall 18. The blocking capacitor 23 is a capacitor for removing the DC component from the high-frequency electric power applied to the bottom wall 18.

The high-frequency shielding unit 24 is a shielding unit for shielding the high-frequency electric field that is formed in the plasma generation region by the discharge electrode 14 and bottom wall 18. The high-frequency shielding cover 25 is a cover for shielding the high-frequency electric field formed outside the vacuum vessel 11 by the discharge electrode 14.

The controller 26 is a control unit that electrically controls the magnitude of the high-frequency electric power output from the high-frequency oscillators 19 and 21 under the control of an operator, for example. This controller 26 controls the magnitudes of the two high-frequency power levels so as to elicit a predetermined value for the ratio between the two. A value may be used, for example, wherewith plasma is obtained having a uniform density distribution in the axial dimension of the discharge electrode 14.

The vacuum vessel 11 is formed, for example, in a cylindrical shape. This vacuum vessel 11 is positioned so that the center axis is vertically oriented. The gas induction unit 12 is formed, for example, in a cylindrical shape. This gas induction unit 12 is provided in the top plate 111 of the vacuum vessel 11. The exhaust unit 13 is formed, for example, in a cylindrical shape. This exhaust unit 13 is provided in the bottom plate 112 of the vacuum vessel 11.

The discharge electrode 14 is formed in a cylindrical shape. This discharge electrode 14 is positioned so that its axis coincides with the axis of the vacuum vessel 11. This discharge electrode 14 is also positioned so as to enclose the plasma generation region 41. This discharge electrode 14, furthermore, is built into the vacuum vessel 11. More specifically, the vacuum vessel 11 is divided in two horizontally. The discharge electrode 14 is inserted between the upper vessel 27 and lower vessel 28 obtained by that division. Hereinafter, the upper vessel 27 is called the top vessel 27, and the lower vessel 28 is called the bottom vessel 28. In this case, the discharge electrode 14 and the top vessel 27 are insulated by a ring-shaped insulator 29. Similarly, the discharge electrode 14 and the bottom vessel 28 are insulated by a ring-shaped insulator 30. The top vessel 27 and bottom vessel 28 are also connected to the reference potential point. In the figure, this reference potential point represents the point where the electric potential is zero, that is, the condition where ground is established.

The two permanent magnets 16 and 16 are formed as rings. These permanent magnets 15 and 16 are positioned coaxially with the vacuum vessel 11. These permanent magnets 15 and 16 are positioned so as to enclose the discharge electrode 14. In this case, the permanent magnet 15 is positioned near the upper edge of the discharge electrode 14, where the permanent magnet 16 is positioned near the lower edge of the discharge electrode 14.

The permanent magnets 15 and 16 are magnetized in the axial dimension thereof. In this case, the permanent magnets 15 and 16 are magnetized in mutually opposing directions. That is, when, for instance, the interior portion of the permanent magnet 15 is the N pole, the exterior portion thereof is magnetized as the S pole. Hereinafter, the interior portion is called the interior, and the exterior portion is called the exterior. In this case, the permanent magnet 16 is magnetized so that its interior is the S pole and its exterior is the N pole. Therefore, in the plasma generation region 41, magnetic force lines 43 are formed which extend from the interior of the permanent magnet 15 toward the center axis 42 of the discharge electrode 14, and thereafter extend toward the interior of the permanent magnet 16. These magnetic force lines 43 have portions that roughly parallel the center axis 42 of the discharge electrode 14. The lengths of these parallel portions become longer the closer they are to the center axis 42. In theory, in this case, the magnetic force lines 43, due to the interaction between the magnetic force lines 43 output from each portion of the permanent magnet 15, at their highest, bend back at the center axis 42 of the discharge electrode 14.

The two walls 17 and 18 are formed, for example, as flat circular plates. These walls 17 and 18 are positioned so as to sandwich therebetween the plasma generation region 41 in the center axis dimension of the discharge electrode 14. These walls 17 and 18 are also positioned perpendicular to the center axis 42 of the discharge electrode 14. In other words, the walls 17 and 18 are positioned in the horizontal. The top wall 17 and the vacuum vessel 11 are insulated by the insulator 31. Thus this top wall 17 is established in an electrically floating state.

The top wall 17 is used, for example, as a gas diffusion plate for diffusing the discharge gas. For this reason, multiple gas diffusion holes 32 are formed in this top wall 17. The bottom wall 18 is used, for example, as a susceptor when this apparatus is used in fabricating a plasma surface treatment apparatus. That is, it is used as the substrate stage on which the substrate is carried.

The high-frequency shielding unit 24 comprises, for example, two ring-shaped metal shielding panels 33 and 34. These metal shielding panels 33 and 34 are positioned coaxially with the vacuum vessel 11. These metal shielding panels 33 and 34 are also positioned between the bottom wall 18 and the bottom vessel 28 so as to enclose the bottom wall 18. In this case, the metal shielding panels 33 and 34 are positioned so as to be separated by a prescribed interval in the dimension of the center axis 42 of the discharge electrode 14. Also, the bottom wall 18 and high-frequency shielding unit 24, are insulated by insulators that are not shown in the drawing. Furthermore, the high-frequency shielding unit 24 and the bottom vessel 28, are established at the same potential.

Exhaust holes 35 and 36 are formed in the metal shielding panels 33 and 34 for exhausting the atmosphere from the plasma generation region 41. These exhaust holes 34 and 36 are formed so that they do not overlap completely. That is, they are formed so that they either overlap partially or do not overlap at all. In this manner, they serve in two capacities, namely to shield the high-frequency electric field, and to exhaust the atmosphere. The high-frequency shielding cover 25 is attached to the outer wall of the vacuum vessel 11 so as to enclose the discharge electrode 14.

In the configuration described above, the vacuum vessel 11 corresponds to the vacuum vessel in the present invention, the gas induction unit 12 corresponds to the gas induction means therein, and the exhaust unit 13 corresponds to the exhaust means therein. The discharge electrode 14, furthermore, corresponds to the discharge electrode in the present invention, the permanent magnets 15 and 16 correspond to the magnetic force line formation means therein, and the two walls 17 and 18 correspond to the two walls therein. The first high-frequency oscillator 19 and the first matching circuit 20 correspond to the first high-frequency power application means in the present invention, the second high-frequency oscillator 21, the second matching circuit 22, and the blocking capacitor 23 correspond to the second high-frequency electric power application means therein, and the controller 26 corresponds to the control means therein.

The plasma generation apparatus of this embodiment, furthermore, is configured so that the magnetic force lines 43 that pass through the center of the plasma generation region 41 are shaped so that they do not intersect the two walls 17 and 18. This is achieved by, for example, appropriately setting the prescribed parameters. These parameters may include, for example, the size of the vacuum vessel 11, position, size, and interval (in the dimension of the center axis 42 of the discharge electrode 14) of the permanent magnets 15 and 16, and the position and interval (in the dimension of the center axis 42 of the discharge electrode 14) of the walls 17 and 18. The non-intersecting configuration described in the foregoing can be implemented by, for example, suitably setting any one or any plurality of these parameters.

The plasma generating action in the configuration described in the foregoing is now described.

The plasma generation action by magnetron discharges is first described.

In this embodiment, when plasma is generated, discharge gas is inducted into the interior of the vacuum vessel 11 by the gas induction unit 12. This discharge gas is diffused uniformly throughout the plasma generation region 41 by the plurality of gas diffusion holes 32 formed in the top wall 17.

In this case, the atmosphere in the interior of the vacuum vessel 11 is exhausted by the exhaust unit 13. Thus the interior of the vacuum vessel 11 is established in a reduced pressure state. In this case, the atmosphere in the plasma generation region 41 is exhausted via the exhaust holes 35 and 36 formed in the metal shielding panels 33 and 34.

In this case, high-frequency electric power is applied to the discharge electrode 14 from the high-frequency oscillator 19 through the matching circuit 20. Thus a high-frequency electric field is formed at the surface of the discharge electrode 14 facing the plasma generation region 41.

In this case, furthermore, magnetic force lines 43 are formed by the permanent magnets 15 and 16. These magnetic force lines 43, as discussed already, have portions that roughly parallel the center axis of the discharge electrode 14. Thus a high-frequency electric field and magnetic field that are roughly perpendicular are formed in the plasma generation region 41. As a result, electrons are trapped in the magnetic force lines 43 in the vicinity of the discharge electrode 14 and exhibit magnetron motion. Due to this magnetron motion, the electrons are accelerated, and the discharge gas is made to discharge. These magnetron discharges cause plasma to be generated in the plasma generation region 41.

Next, the action of producing plasma by high-frequency oscillation discharges is described.

When plasma is generated in this embodiment, high-frequency electric power is also applied to the bottom wall 18, from the high-frequency oscillator 21, via the mixing circuit 22 and blocking capacitor 23. A high-frequency electric field is thereby formed that is oriented in the direction of the center axis 42 of the discharge electrode 14 in the plasma generation region 41. As a result, the high-energy electrons trapped in the magnetic force lines 43 are made to oscillate at high frequency in the direction of the center axis 42. The high-energy electrons are heated by this high-frequency oscillation. This heating causes the discharge gas to discharge. The resulting high-frequency oscillation discharges generate plasma in the plasma generation region 41. This plasma is hereinafter called the second plasma.

Next, the first plasma density is discussed.

The plasma density mentioned above is dependent on the magnetron discharge generation efficiency. This magnetron discharge generation efficiency, in turn, is dependent on the strengths of the high-frequency electric field formed by the discharge electrode 14 and the strengths and shapes of the magnetic field formed by the permanent magnets 15 and 16. The high-frequency electric field and the magnetic field become stronger at the periphery than in the center of the plasma generation region 41. This is because the periphery of the plasma generation region 41 is closer to the discharge electrode 14 and to the permanent magnets 15 and 16 than is the center thereof. Therefore, the magnetron discharge generation efficiency becomes higher at the periphery of the plasma generation region 41 than in the center thereof. As a consequence, the density of the first plasma becomes higher at the periphery of the plasma generation region 41 than in the center.

The magnetron discharge generation efficiency, however, is dependent not only on the intensities of the high-frequency electric field and magnetic field, respectively, but also on the number of high-energy electrons trapped in the magnetic force lines 43. The number of these high-energy electrons becomes larger if the magnetic force lines 43 do not intersect the walls 17 and 18. This is so because, when the magnetic force lines 43 do intersect the walls 17 and 18, the high-energy electrons trapped in these magnetic force lines 41 flow out via the walls 17 and 18.

In this embodiment, the magnetic force lines 43 that pass through the center of the plasma generation region R are established so that they do not intersect the walls 17 and 18. Thus the outflow of high-energy electrons in the center of the plasma generation region 41 is suppressed. As a result, magnetron discharge generation efficiency is raised in the center just as at the periphery. Thus the first plasma generation efficiency is raised in the center just as at the periphery. As a consequence, high-density first plasma is obtained in the center just as at the periphery.

Next, the second plasma density is discussed.

The density of the second plasma is dependent on the high-frequency oscillation discharge generation efficiency. This generation efficiency, in turn, is dependent on the lengths of those portions of the magnetic force lines 43 which are roughly parallel to the center axis 42 of the discharge electrode 14. In other words, if the lengths of those parallel portions become longer, the high-frequency oscillation discharge generation efficiency rises, and if those lengths become shorter, that efficiency declines. This is so because, when the lengths of the parallel portions become long, so does the distance over which the high-energy electrons can exhibit accelerated motion.

In this embodiment, the lengths of the parallel portions are longer in the center of the plasma generation region 41 than at the periphery. Thus the high-frequency oscillation discharge generation efficiency is higher in the center of the plasma generation region 41 than at the periphery thereof. As a consequence, the density of the second plasma is higher in the center of the plasma generation region 41 than at the periphery.

Thus it is seen that, when high-frequency oscillation discharges are generated, as compared to when they are not generated, the density of the plasma in the center of the plasma generation region 41 can be raised higher. Next, plasma density control is discussed.

The density of the first plasma, as discussed in the foregoing, is dependent on the strength of the high-frequency electric field formed by the discharge electrode 14. This strength of the high-frequency electric field, in turn, is dependent on the magnitude of the high-frequency electric power output from the first high-frequency oscillator 19. This high-frequency power magnitude is controlled by the controller 26, under the control of an operator. Thus the density of the first plasma is controlled by controlling this high-frequency power magnitude, under the control of an operator.

The density of the second plasma is dependent on the strength of the high-frequency electric field formed by the bottom wall 18. This high-frequency electric field strength, in turn, is dependent on the magnitude of the high-frequency electric power output from the second high-frequency oscillator 21. This high-frequency electric power magnitude is controlled by the controller 26, under the control of an operator. Thus the density of the second plasma is controlled by controlling this high-frequency electric power magnitude, under the control of an operator.

The density of the first plasma, as explained above, becomes higher at the periphery of the plasma generation region 41 than in the center thereof. On the contrary, the density of the second plasma, as also explained above, becomes higher in the center of the plasma generation region 42 than at the periphery. Accordingly, by appropriately controlling the magnitudes of the two high-frequency electric power levels, as noted above, it is possible to obtain plasma having a uniform density distribution throughout the entire plasma generation region 41.

The ratio between the two high-frequency electric power levels when plasma exhibiting a uniform density distribution is obtained is roughly constant, irrespective of the plasma density. In this embodiment, therefore, this fact having been duly noted, when two high-frequency electric power magnitudes are controlled, that control is effected so that the ratio between the two becomes a predetermined value. Therefore, when the magnitude of one of the two high-frequency power levels is designated by an operator, the magnitude of the other power level is automatically adjusted. As a result, plasma can be obtained which always exhibits a uniform density distribution throughout the entire plasma generation region 41.

Next, the differences between the plasma generation method using the walls 17 and 18 and the plasma generation method using conventional parallel plate electrodes are discussed.

The walls 17 and 18 in this embodiment have roughly the same shape as conventional parallel plate electrodes. Nevertheless, the method of generating plasma (second plasma) by the walls 17 and 18 differs from the plasma generation method by conventional parallel plate electrodes.

That is, with the plasma generation method using conventional parallel plate electrodes, the plasma is mainly generated, by secondary electrons output by the impact of ions on the surface of the plate electrodes, after the ions have been accelerated by the sheath voltage of the plate electrodes, by electron heating caused by high-frequency fluctuations in the sheath voltage, and by electron heating caused by the ohmic resistance of the plasma.

In contrast, in the method of generating plasma using the walls 17 and 18, the plasma is generated by electron heating caused by the high-frequency oscillation of high-energy electrons trapped in the magnetic force lines 43.

With the plasma generation method based on conventional plate electrodes, when the discharge gas pressure is high, it is possible to generate plasma having somewhat high density. When the gas pressure is low, however, high-density plasma cannot be generated. By a high gas pressure is here meant a gas pressure of 1 Torr or higher, for example. By a low gas pressure is meant a gas pressure of 30 m Torr or lower, for example.

In this embodiment, however, magnetic force lines 43 are formed which do not intersect the walls 17 and 18. Thus high-energy electrons are efficiently trapped in the magnetic force lines 43. As a result, high-density plasma can be generated even when the gas pressure is as low as 1 m Torr. The benefits of this embodiment are now discussed.

This embodiment, as described in the foregoing, provides the following benefits.

Firstly, when this embodiment is implemented, magnetic force lines 43 that pass through the center of the plasma generation region 41 are established so that they do not intersect the walls 17 and 18. Because this is so, magnetron discharge generation efficiency can be raised in the center of the plasma generation region 41 just as at the periphery thereof. As a consequence, high density first plasma can be generated in the center just as at the periphery. Incidentally, with this embodiment, using the same magnitude of high-frequency electric power applied to the discharge electrode 14 as in the apparatus described in the literature cited above, the density of the first plasma can be raised by a factor of 10.

When this embodiment is implemented, moreover, the two walls 17 and 18 are formed of a material exhibiting electrical conductivity. Therefore, using these walls 17 and 18, the density of the second plasma can be electrically controlled.

When this embodiment is implemented, furthermore, high-frequency electric power is applied to the bottom wall 18. Thus it is possible to generate high-frequency oscillation discharges. As a result, the density of the plasma in the center of the plasma generation region 41 can be raised even higher than when these discharges are not generated.

When this embodiment is implemented, moreover, the top wall 17 is established in an electrically floating state. Thus it is possible to lower the sheath voltage in the surface of this top wall 17. As a result, it is possible to reduce the metal contamination in the top wall 17 that is caused by the sheath voltage.

When this embodiment is implemented, furthermore, the high-frequency electric power applied to the discharge electrode 14 and the high-frequency electric power applied to the top wall 18 are output from separate high-frequency oscillators 19 and 21. Thus the magnitudes of the two high-frequency electric power levels can be set independently. As a result, the densities of the first and second plasma, respectively, can be set independently. Thus it is possible to establish uniform plasma density distribution in the axial direction of the discharge electrode 14.

When this embodiment is implemented, moreover, a controller 26 is provided for controlling the magnitudes of the high-frequency electric power output from the high-frequency oscillators 19 and 21. Thus the densities of the first and second plasmas, respectively, can be controlled. As a consequence, it is possible to control the plasma density distribution in the axial dimension of the discharge electrode 14.

When this embodiment is implemented, furthermore, when the magnitudes of the two high-frequency electric power levels are controlled, they are controlled so that the ratio between the two is always at a predetermined value. Thus the prescribed plasma density distribution can be effected continually in the radial dimension of the discharge electrode 14. Also, the work load on the operator when controlling high-frequency electric power magnitudes can be reduced.

When this embodiment is implemented, moreover, the two walls 17 and 18 are provided as dedicated walls instead of being the top plate 111 and bottom plate 112 of the vacuum vessel 11. Thus the top wall 17 can be utilized as a gas diffusion plate for diffusing the discharge gas. Also, when the plasma generation apparatus of this embodiment is used in configuring a plasma surface treatment apparatus, the bottom wall 18 can be used as a susceptor for carrying substrates.

A modification of this embodiment is now described.

In the foregoing description, a case is described wherein the top wall 17 is established in an electrically floating state. In this embodiment, however, this may be fashioned so that it is connected to ground. In this configuration also, the average plasma space potential can be made smaller. Thus it is possible to suppress metal contamination caused by other ground electrode.

Figure 2:
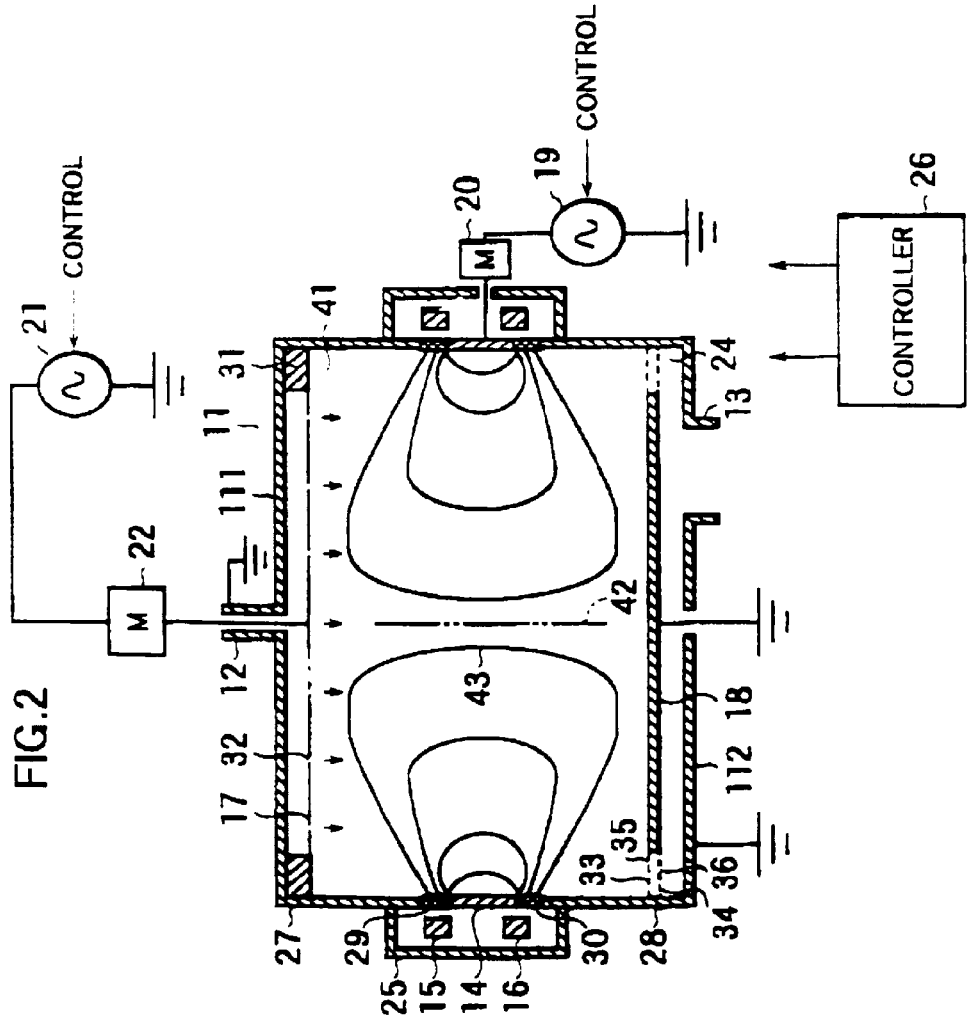
FIG. 2 is a lateral cross-sectional diagram of a second embodiment of the present invention.

FIG. 2 is a lateral cross-sectional diagram representing the configuration of the second embodiment of the present invention. In the apparatus diagrammed in FIG. 2, the same reference characters are used to designate configurational elements having virtually the same function as those in the apparatus diagrammed in FIG. 1, and no detailed description of those elements is given here. This applies also to the third and following embodiments described subsequently.

In the first embodiment, high-frequency electric power is applied to the bottom wall 18. In this embodiment, however, as diagrammed in FIG. 2, high-frequency electric power is applied to the top wall 17, and the bottom wall 18 is connected to ground.

With this configuration, while obtaining virtually the same benefits as in the previous embodiment, the following benefits are also obtained.

That is, when this embodiment is implemented, the bottom wall 18 is connected to ground. Therefore, the sheath voltage on the surface of the bottom wall 18 can be made lower. As a result, damage done to the bottom wall 18 by the sheath voltage can be reduced.

Furthermore, when this apparatus is used in fabricating a plasma surface treatment apparatus, the sheath voltage on the surface of the substrate carried on the bottom wall 18 can be made lower. As a consequence, damage done to the substrate by the sheath voltage can be reduced.

A third embodiment will now be described.

Figure 3:
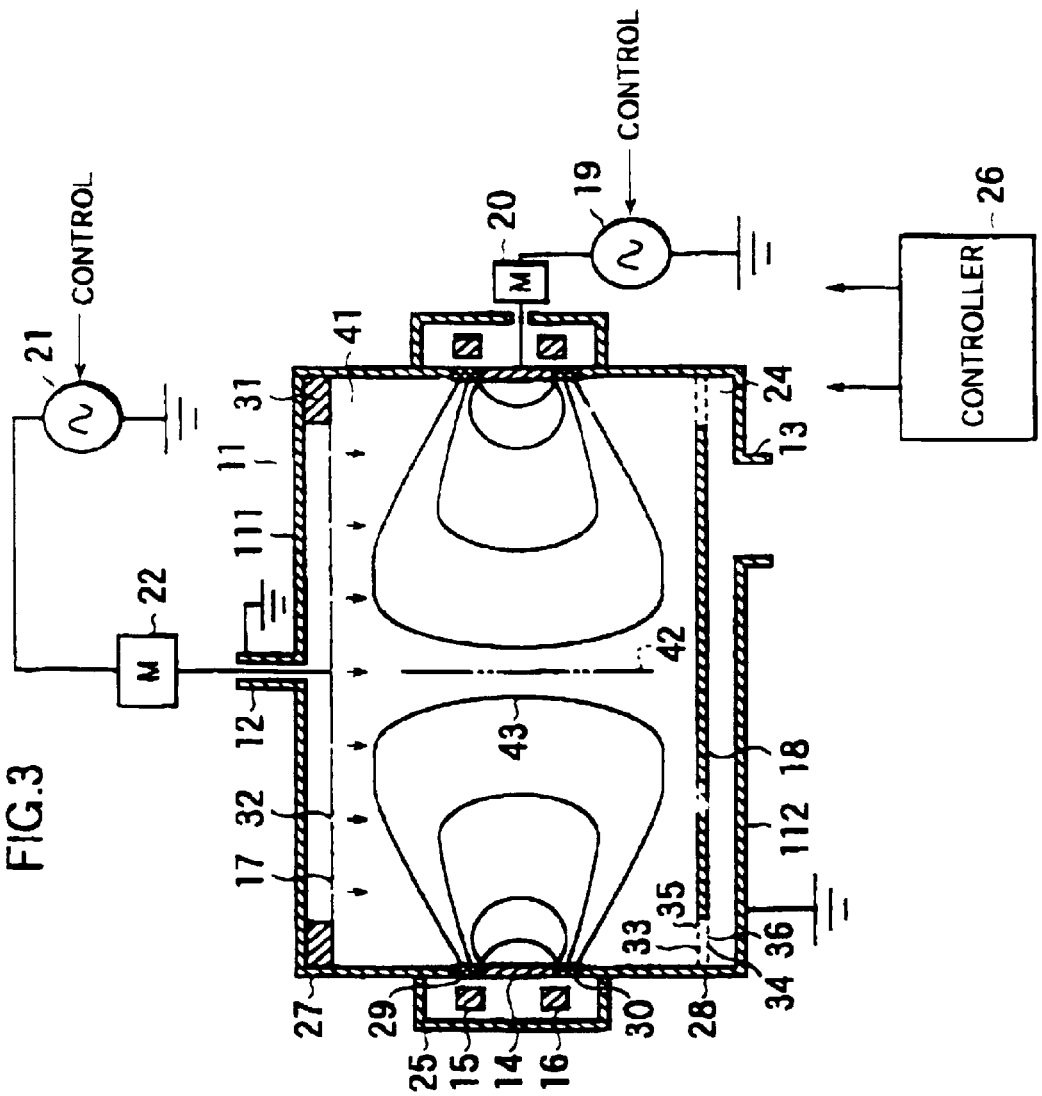
FIG. 3 is a lateral cross-sectional diagram of a third embodiment of the present invention.

FIG. 3 is a lateral cross-sectional diagram representing the configuration of the third embodiment of the present invention.

In the second embodiment, as described above, the bottom wall 18 is grounded. In this third embodiment, however, as diagrammed in FIG. 3, the bottom wall 18 is established in an electrically floating state.

When this configuration is effected, the sheath voltage on the surface of the bottom wall 18 and substrate can be reduced even further than with the second embodiment. Thus damage done to the bottom wall 18 and substrates by the sheath voltage can be reduced even further.

A fourth embodiment is now described.

Figure 4:
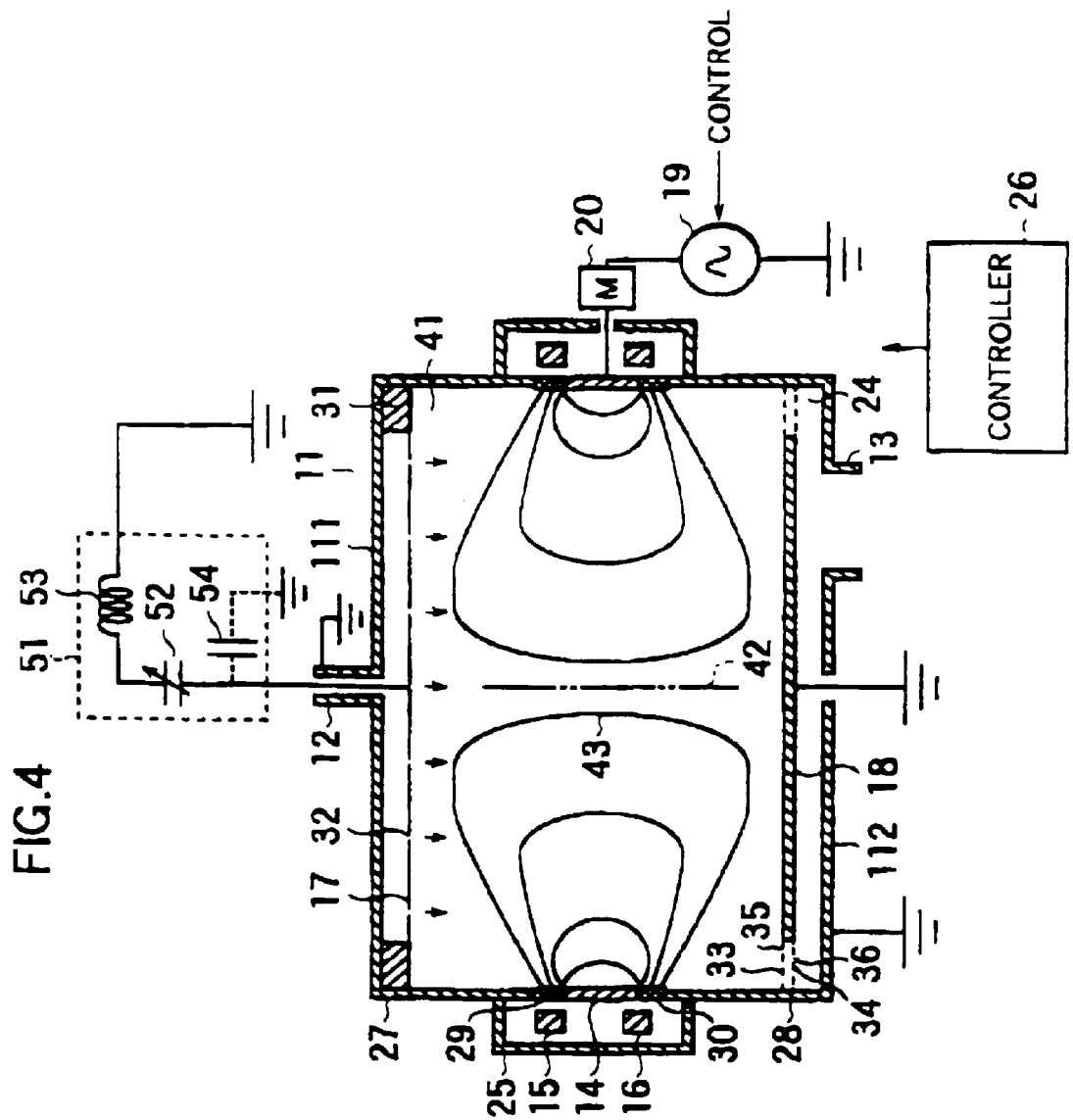
FIG. 4 is a lateral cross-sectional diagram of a fourth embodiment of the present invention.

FIG. 4 is a lateral cross-sectional diagram representing the configuration of the fourth embodiment of the present invention.

In the first, second, and third embodiment, as described, when high-frequency electric power is applied to the top wall 17 or the bottom wall 18, it is applied using the high-frequency oscillator 21. In other words, in the embodiments described, the power is applied using a high-frequency power supply that itself is capable of outputting the high-frequency power. In this fourth embodiment, however, as diagrammed in FIG. 4, this power is applied using a high-frequency oscillator circuit 51.

This high-frequency oscillator circuit 51 is configured so as to resonate with the high-frequency electric power output from the high-frequency oscillator 19 for use by the discharge electrode 14. This high-frequency oscillator circuit 51, furthermore, comprises a variable capacitor 52, coil 53, and distributed capacitance 54, for example. The variable capacitor 52 here is a capacitor for adjusting the resonant frequency. This series circuit is inserted between the top wall 17 and ground. The distributed capacitance 54 is the distributed capacitance that is formed between the upper wall 17 and ground. In FIG. 4, this distributed capacitance is represented as a single capacitor for convenience.

In this embodiment, no second high-frequency oscillator 21 is provided. For that reason, the controller 26 controls only the magnitude of the high-frequency electric power output from the high-frequency oscillator 19.

In such a configuration as this, the high-frequency oscillator circuit 51 resonates with the high-frequency electric power applied to the discharge electrode 14 from the high-frequency oscillator 19. Thus high-frequency electric power is also applied from the high-frequency oscillator 19 to the top wall 17 via the high-frequency oscillator circuit 51.

With such a configuration as this, only one high-frequency oscillator need be used. Thus the circuitry of the apparatus can be made simpler, and circuit fabrication costs reduced.

In FIG. 4, the bottom wall 18 is diagrammed as grounded. In this embodiments, however, it is also permissible to put the bottom wall 18 in an electrically floating state as in the third embodiment.

In FIG. 4, furthermore, the high-frequency oscillator circuit 51 is diagrammed as connected to the top wall 17. However, in this embodiment, the high-frequency oscillator circuit 51 may be connected to the bottom wall 18 as in the first embodiment.

A fifth embodiment is now described.

Figure 5:
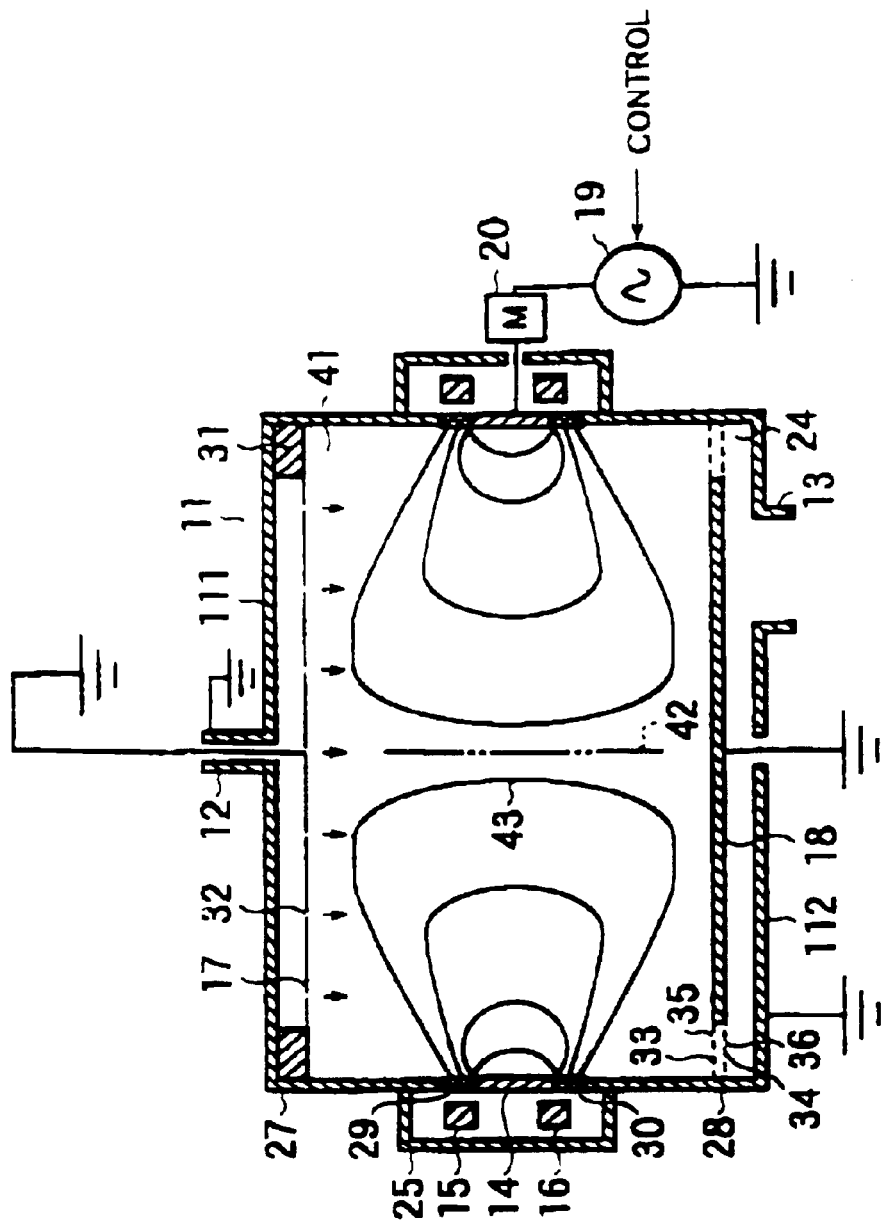
FIG. 5 is a lateral cross-sectional diagram of a fifth embodiment of the present invention.

FIG. 5 is a lateral cross-sectional diagram representing the configuration of the fifth embodiment of the present invention. In the first to the fourth embodiment, as described, high-frequency electric power is applied to one or other of the two walls 17 and 18. In this fifth embodiment, however, both of the walls 17 and 18 are grounded, as diagrammed in FIG. 5. In this embodiment, furthermore, no high-frequency electric power is applied, so the controller 26 is unnecessary.

When such a configuration as this is implemented, the sheath voltage on the surface of the walls 17 and 18 can be made smaller. When this is done, the damage done to the walls 17 and 18 by the sheath voltage can be reduced. Similarly, when the bottom wall 18 is used as a susceptor, the damage done to the substrates by the sheath voltage can also be reduced.

A sixth embodiment is now described.

Figure 6:
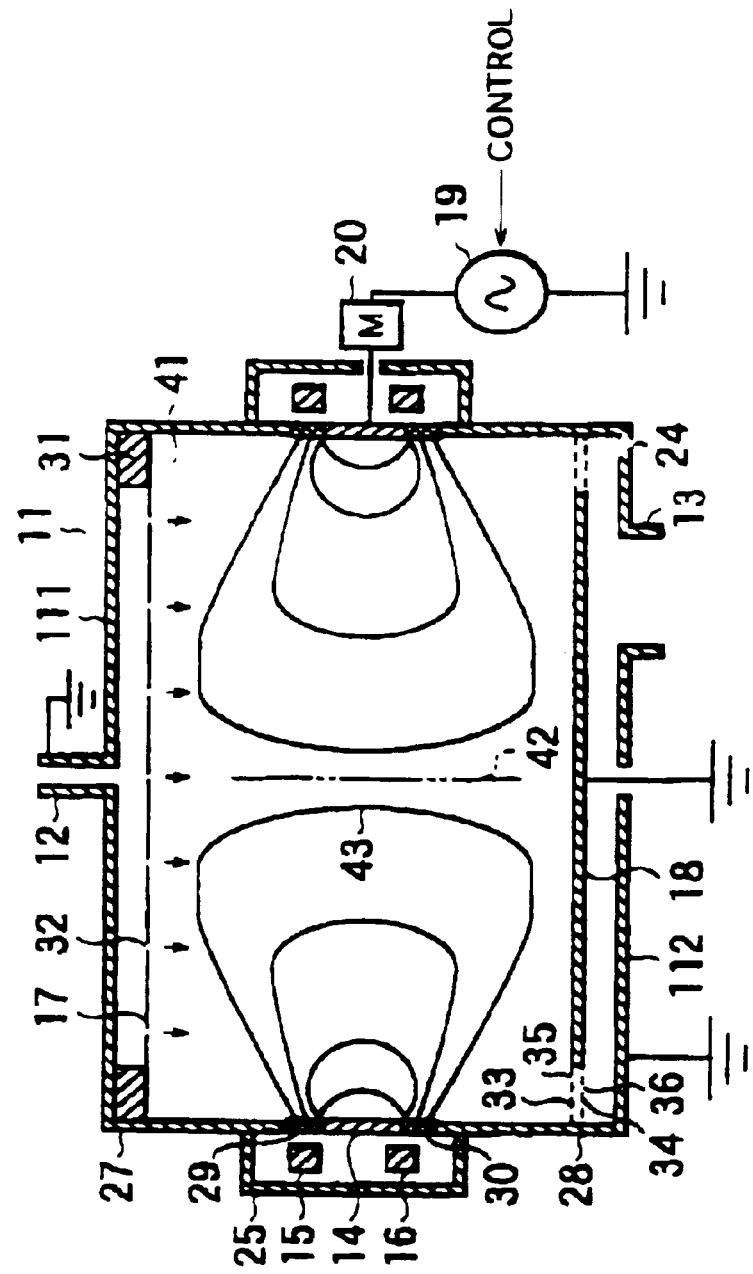
FIG. 6 is a lateral cross-sectional diagram of a sixth embodiment of the present invention.

FIG. 6 is a lateral cross-sectional diagram representing the configuration of the sixth embodiment of the present invention.

In the fifth embodiment, both of the wails 17 and 18 are described as being grounded. In this sixth embodiment, however, the top wall 17 is established in an electrically floating state, as diagrammed in FIG. 6.

When such a configuration as this is effected, the sheath voltage on the surface of the top wall 17 can be made smaller than it can be in the fifth embodiment. Thus using this embodiment, it is possible to further reduce contamination by metal from the top wall 17 caused by the sheath voltage.

A seventh embodiment is now described.

Figure 7:
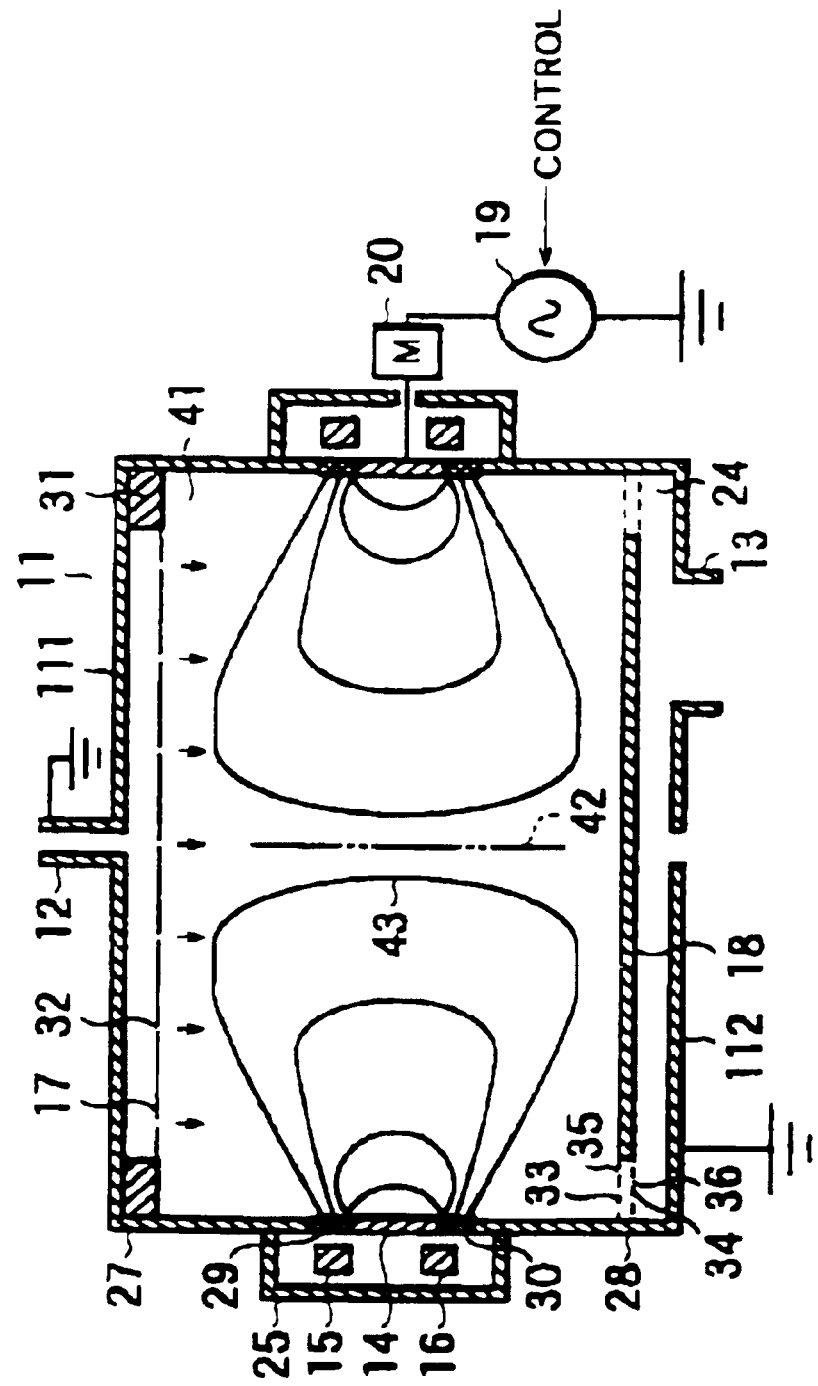
FIG. 7 is a lateral cross-sectional diagram of a seventh embodiment of the present invention.

FIG. 7 is a lateral cross-sectional diagram representing the configuration of the seventh embodiment of the present invention.

In the sixth embodiment, as described, only the top wall 17 is established in an electrically floating state. In this seventh embodiment, however, the bottom wall 18 is also established in an electrically floating state, as diagrammed in FIG. 7.

When such a configuration as this is effected, the sheath voltage on the surface of the bottom wall 18 or substrates can be made smaller. Thus it is possible to reduce the damage done to the bottom wall 18 or substrates by the sheath voltage.

An eighth embodiment is now described.

Figure 8:
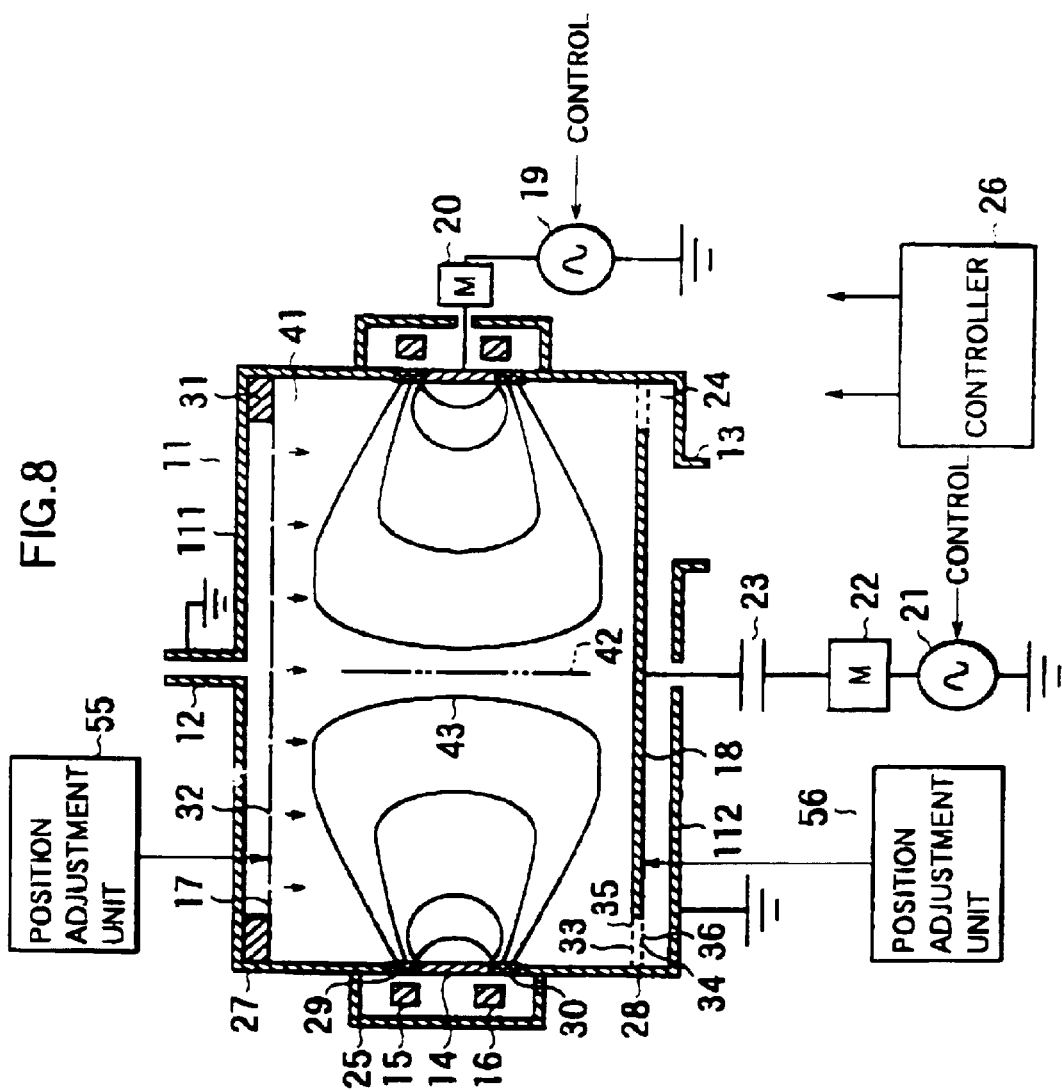
FIG. 8 is a lateral cross-sectional diagram of an eighth embodiment of the present invention.

FIG. 8 is a lateral cross-sectional diagram representing the configuration of the eighth embodiment of the present invention.

In the first to the seventh embodiment, as described, the positions of the two walls 17 and 18 are fixed. By the positions of the two walls 17 and 18 is here meant the positions in the dimension of the center axis 42 of the discharge electrode 14 (and so hereinafter). In this eighth embodiment, however, as diagrammed in FIG. 8, a position adjustment unit 55 capable of adjusting the position of the top wall 17 and a position adjustment unit 56 capable of adjusting the position of the bottom wall 18 are provided.

A wide variety of configurations are possible for these position adjustment units 55 and 56. In one possible configuration, for example, the walls 17 and 18 are each held by a sliding mechanism whereby the walls 17 and 18 can be made to slide in the dimension of the center axis 42 of the discharge electrode 14. In another possible configuration, the walls 17 and 18 are each held by an elevator mechanism whereby the walls 17 and 18 can be driven so as to rise or descend in the dimension of the center axis 42 of the discharge electrode 14. In FIG. 8 the position adjustment units 55 and 56 are represented conceptually.

When such a configuration as this is effected, after assembling the apparatus, the positions of the two walls 17 and 18 can be adjusted. Thus, after assembling the apparatus, magnetic force lines 43 can be formed such as do not intersect the two walls 17 and 18, thereby making it easy to form such magnetic force lines 43.

When such a configuration as this is effected, furthermore, the positions of the two walls 17 and 18 can be adjusted independently, thereby rendering the position adjustment operation simple.

A ninth embodiment of the present invention is now described.

The external configuration of this ninth embodiment is, for example, the same in form as the first embodiment. The difference therebetween lies in the relationship between the magnetic force lines 43 and the two walls 17 and 18.

That is, in the first embodiment, as described, the magnetic force lines 43 are formed so that they do not intersect the two walls 17 and 18 over the entire plasma generation region 41. In this ninth embodiment, however, such magnetic force lines 43 are formed only at the periphery of the plasma generation region 41, with none being formed in the center thereof.

With this configuration also it is possible to generate high-density plasma in the center of the plasma generation region. This is because it is possible to make the high-energy electrons trapped in the magnetic force lines 43 to exhibit high-frequency oscillation.

That is, in this embodiment, in the center of the plasma generation region 41, all of the magnetic force lines 43 intersect the two walls 17 and 18. Thus, in this portion, the number of high-energy electrons trapped in the magnetic force lines becomes small. As a result, in this portion, the first plasma generation efficiency declines.

In this embodiment, however, high-frequency electric power is applied to the bottom wall 18. Thus the high-energy electrons trapped in the magnetic force lines 43 are made to exhibit high-frequency oscillation. As a result, second plasma is generated. The second plasma generation efficiency is higher in the center of the plasma generation region 41 than at the periphery thereof. Thus the decline in the first plasma generation efficiency in the center of the plasma generation region 41 is compensated for by the second plasma. As a consequence, high-density plasma can be generated also in the center of the plasma generation region 43.

In the description given above, a case is described wherein this embodiment is applied to the apparatus diagrammed in FIG. 1. However, so long as it is an apparatus configured such that high-frequency electric power is applied to one of the two walls 17 and 18, this embodiment may also be applied to apparatuses other than the one diagrammed in FIG. 1. Accordingly, this embodiment may also be applied to the apparatuses diagrammed in FIGS. 2, 3, and 4.

Performance comparisons are now made.

FIG. 9 is a table in which the performance of multiple plasma generation apparatuses is compared.

The plurality of plasma generation apparatuses here compared includes the plasma generation apparatus in the first embodiment (i.e, the apparatus diagrammed in FIG. 1), the plasma generation apparatus in the fourth embodiment (i.e. the apparatus diagrammed in FIG. 4), the plasma generation apparatus in the sixth embodiment (i.e. the apparatus diagrammed in FIG. 8), and a plasma generation apparatus wherein magnetron discharges are not used.

The plasma generation apparatus wherein magnetron high-frequency discharges are not used that is compared here is the apparatus diagrammed in FIG. 10. The apparatus diagrammed therein is the apparatus diagrammed in FIG. 2 with the discharge electrode 14 removed. With such a configuration as this, only the second plasma is generated by the high-frequency oscillations of the high-energy electrons trapped in the magnetic force lines 43.

The performance categories compared include the plasma generation efficiency, the plasma density distribution controllability, how large the caliber of the apparatus becomes, and the apparatus cost, as seen in FIG. 9. The plasma generation efficiency here represents the degree to which high plasma density is realized. The plasma density distribution controllability represents the degree of difficulty in realizing uniform plasma density distributions. How large the caliber of the apparatus becomes represents the ability of the apparatus to handle substrates of large diameter.

Performance is indicated by three symbols, namely a double circle, circle, and triangle. Here the double circle indicates the best performance, the circle indicates the second best performance, and the triangle represents the third best performance.

Plasma generation efficiencies are now compared.

As may be seen in FIG. 9, the plasma generation efficiency is higher in the apparatuses diagrammed in FIGS. 1 and 4 than in the apparatuses diagramed in FIGS. 6 and 10. The reason for this is that, in the apparatuses diagrammed in FIGS. 1 and 4, first plasma and second plasma are generated, whereas in the apparatus diagrammed in FIG. 6, only first plasma is generated, and in the apparatus diagrammed in FIG. 10, only second plasma is generated. The plasma generation efficiency is higher in the apparatus diagrammed in FIG. 1 than in the apparatus diagrammed in FIG. 4. This is because the efficiency with which high-frequency electric power is applied to the top wall 17 or bottom wall 18 is higher in the apparatus diagrammed in FIG. 1 than in the apparatus diagrammed in FIG. 4.

Incidentally, if we represent the plasma generation efficiency of the apparatus diagrammed in FIG. 6 as 1, the plasma generation efficiency of the apparatus diagrammed in FIG. 1 is 4 or higher, and the plasma generation efficiency of the apparatus diagrammed in FIG. 4 is 4. Thus the plasma density is higher in the apparatus diagrammed in FIG. 4 than in the apparatuses diagrammed in FIGS. 8 and 10, and higher still in the apparatus diagrammed in FIG. 1.

Plasma density distribution controllability is now compared.

Plasma density distribution controllability is expressed as the range through which the plasma density distribution can be electrically controlled. This range is broader in the apparatus diagrammed in FIG. 1 than in the apparatus diagrammed in FIG. 4. The reason for this is that, with the apparatus diagrammed in FIG. 1, the first and second plasma densities can be controlled independently, whereas with the apparatus diagrammed in FIG. 4, these densities cannot be independently controlled. Consequently, the degree of difficulty in achieving uniform plasma density distribution is lower in the apparatus diagrammed in FIG. 1 than in the apparatus diagrammed in FIG. 4.

In the apparatuses diagrammed in FIGS. 6 and 10 furthermore, plasma density is higher than in the conventional apparatus, and the plasma density distribution is more uniform. In these apparatuses, however, the plasma density distribution cannot be electrically controlled. This is so because only the density of the first plasma is controlled in the apparatus diagrammed in FIG. 6, and only the density of the second plasma is controlled in the apparatus diagrammed in FIG. 10.

Apparatus caliber enlargement is now compared.

Apparatus caliber enlargement is expressed in terms of how large the aperture diameter is. This larger caliber size is easier to implement in the apparatus diagrammed in FIG. 4 than in the apparatuses diagrammed in FIGS. 6 and 10. This is due to the fact that, whereas in the latter it is not possible to electrically control the plasma density distribution, in the former it is possible to do so. The larger caliber size is also easier to implement in the apparatus diagrammed in FIG. 1 than in the apparatus diagrammed in FIG. 4. This is because plasma density distribution controllability is better in the former than in the latter. Therefore, in terms of handling larger and larger substrate diameters, the apparatus diagrammed in FIG. 4 is better than the apparatuses diagrammed in FIGS. 6 and 10, and the apparatus diagrammed in FIG. 1 is better still.

Apparatus cost is now compared.

Apparatus cost is expressed in terms of how inexpensive an apparatus is. The cost of all these apparatuses is low. Among them, however, the apparatuses diagrammed in FIGS. 4, 6, and 10 are less expensive than the apparatus diagrammed in FIG. 1. This is due to the fact that, whereas only one high-frequency oscillator is provided in the former apparatuses, two are provided in the latter apparatus.

Nine embodiments are described in detail in the foregoing. The present invention, however, is in no way limited to those embodiments.

For example, the embodiments are described above as having two walls 17 and 18 formed of a material exhibiting electrical conductivity. In the present invention, however, these may be formed of materials exhibiting insulative properties. When this is done, with such a configuration as this, it is possible to eliminate metal contamination from the walls 17 and 18.

The foregoing embodiments are described, moreover, as having the walls 17 and 18 positioned horizontally, and as having the discharge electrode 14 positioned vertically. In the present invention, however, the walls 17 and 18 may be positioned vertically and the discharge electrode 14 positioned horizontally.

In the foregoing embodiments, furthermore, the walls 17 and 18 are described as being provided separately from the top plate 111 and bottom plate 112. In the present invention, however, the top plate 111 and bottom plate 112 may be used as the walls 17 and 18, respectively.

Needless to say, the present invention can be variously modified in other ways so long as the essential idea thereof is not departed from. The benefits of the present invention are now discussed.

When the plasma generation apparatus cited in claim 1 above is implemented, the magnetic force lines that pass through the center of the plasma generation region are established so that they do not intersect the two walls. Thus high-density plasma can be generated at the center of the plasma generation region as well as at the periphery thereof.

When the plasma generation apparatus cited in claim 2 is implemented, the two walls in the apparatus cited in claim 1 are formed of a material exhibiting electrical conductivity. It is thus possible to electrically control plasma density using these walls.

When the plasma generation apparatus cited in claim 3 is implemented, high-frequency electric power is applied to one of the two walls in the apparatus cited in claim 2. It is thus possible to improve plasma generation efficiency in the center of the plasma generation region.

When the plasma generation apparatus cited in claim 4 is implemented, the other of the two walls in the apparatus cited in claim 3 is connected to a reference potential point. Thus it is possible to reduce metal contamination from the other electrode surface connected to the reference potential point.

When the plasma generation apparatus cited in claim 5 is implemented, the other of the two walls in the apparatus cited in claim 3 is established in an electrically floating state. It is thus possible to reduce the damage done to that other wall of the two walls by the sheath voltage.

When the plasma generation apparatus cited in claim 6 is implemented, the other of the two walls is used as a holder for holding the object being treated in the apparatus cited in claim 4 or 5. It is thus possible to reduce the damage done to the object being treated by the sheath voltage.

When the plasma generation apparatus cited in claim 7 is implemented, the high-frequency electric power applied to the discharge electrode and the high-frequency electric power applied to one of the two walls are output from separate high-frequency electric power supplies. It is thus possible to establish the magnitudes of these two high-frequency electric power levels independently. As a consequence, it is possible also to establish a uniform plasma density distribution in the radial dimension of the discharge electrode.

When the plasma generation apparatus cited in claim 8 is implemented, the high-frequency electric power on one of the two walls in the apparatus cited in claim 3 is applied from the discharge electrode high-frequency electric power supply via a high-frequency resonant circuit. It is thus possible to limit the number of high-frequency power supplies to one.

When the plasma generation apparatus cited in claim 9 is implemented, both of the two walls in the apparatus cited in claim 2 are connected to the reference potential point. It is thus possible to reduce the damage done to the two walls by the sheath voltage.

When the plasma generation apparatus cited in claim 10 is implemented, a controller is provided for controlling the magnitude of the high-frequency electric power applied to the discharge electrode in the apparatus cited in claim 1. It is thus possible to control the density of the first plasma.

When the plasma generation apparatus cited in claim 11 is 10 implemented, a controller or controllers are provided for controlling the magnitude of the high-frequency electric power output from the first and second high-frequency electric power supplies. It is thus possible to control the densities of the first and second plasmas. As a result, it is possible to control the plasma density distribution in the radial dimension of the discharge electrode.

When the plasma generation apparatus cited in claim 12 is implemented, in cases where the magnitudes of the high-frequency electric power output from the first and second high-frequency electric power supplies are controlled, in the apparatus cited in claim 11, that control is effected so that the ratio between the two power levels is always a predetermined value, it is thus possible, when controlling plasma density, to effect such control so that the prescribed plasma density distribution is always maintained, it is also possible to reduce operator work load when controlling the magnitude of the high-frequency electric power.

When the plasma generation apparatus cited in claim 13 is implemented, by controlling the magnitude of the high-frequency electric power applied to the discharge electrode in the apparatus cited in claim 8, the magnitude of the high-frequency electric power applied to one of the two walls can be controlled automatically. It is thus possible to reduce the operator work load when controlling the magnitude of the high-frequency electric power.

When the plasma generation apparatus cited in claim 14 is implemented, the positions of the two walls in the apparatus cited in claim 1 can be adjusted. Thus it is possible, after assembling the apparatus, to form the magnetic force lines so that they do not intersect the two walls. It therefore becomes easy to form such magnetic force lines.

When the plasma generation apparatus cited in claim 15 is implemented, one of the two walls is used as a diffusion plate in the apparatus cited in claim 1. It is thus possible to diffuse the discharge gas uniformly in the plasma generation region. Furthermore, the other of the two walls is used as a holder for the object being treated when performing prescribed treatments on objects being treated using plasma. It is thus possible, when configuring a plasma treatment apparatus using this apparatus, to keep the configuration simple.

When the plasma generation apparatus cited in claim 16 is implemented, high-frequency electric power is supplied to one of the two walls. It is thus possible to generate high-frequency oscillation discharges in addition to magnetron discharges. As a consequence, even when there are no magnetic force lines that do not intersect the two walls, it is possible to generate high-density plasma in the center of the plasma generation region.

What is claimed is:

1. A plasma generation apparatus, comprising:
    a vacuum vessel having a plasma generation region established in an interior thereof;
    a gas inductor that inducts discharge gas into said interior of said vacuum vessel;
    an exhaust that exhausts an atmosphere in the interior of said vacuum vessel;
    a tube-shaped discharge electrode fashioned so as to enclose said plasma generation region;
    a first high-frequency electric power applicator that applies first high-frequency electric power to said discharge electrode;
    a first magnetic force line generating portion positioned near one end portion of an outer periphery of said discharge electrode; and
    a second magnetic force line generating portion positioned near the other end portion of an outer periphery of said discharge electrode,
    wherein said first and second magnetic force line generating portions generate magnetic force lines having portions roughly parallel to the center axis of said discharge electrode, such that the length of said parallel portions becomes longer the closer said magnetic force lines are to said center axis, said magnetic force lines being capable of trapping electrons at least in a center of said plasma generation region.

2. A plasma generation apparatus according to claim 1, wherein said first magnetic force line generating portion is fashioned so as to output magnetic force lines in said plasma generation region, and
    wherein said second magnetic force line generating portion is fashioned so as to input said magnetic force lines having been output in said plasma generation region by said first magnetic force line generating portion.

3. A plasma generation apparatus according to claim 2, wherein said first magnetic force line generating portion comprises:
    a first magnet unit, and is fashioned so that a N pole of said first magnet unit faces said plasma generation region and an extended line of a straight line connecting a N pole and a S pole of said magnet intersects a center axis of said discharge electrode substantially perpendicular to a peripheral direction of said discharge electrode, about at a right angle, and
    wherein said second magnetic force line generating portion comprises:
    a second magnet unit, and is fashioned so that a S pole of said second magnet unit faces said plasma generation region and an extended line of a straight line connecting a N pole and a S pole of said magnet intersects said center axis of said discharge electrode about at a right angle.

4. A plasma generation apparatus according to claim 1, further comprising:
    two walls positioned so as to sandwich said plasma generation region between them, in the direction of the center axis of said discharge electrode, for defining the scope of said plasma generation region in the direction of the center axis.

5. A plasma generation apparatus according to claim 4, further comprising:
    a position adjuster that adjusts positions of said two walls in said center axis of said discharge electrode.

6. A plasma generation apparatus according to claim 4, wherein one of said two walls is used as gas diffusion plate for diffusing said discharge gas in said plasma generation region, and wherein the other of said two walls, when said plasma is used in subjecting objects to be treated to prescribed treatments, is used as a holder for holding said objects to be treated.

7. A plasma generation apparatus according to claim 4, wherein said two walls are electrode.

8. A plasma generation apparatus according to claim 1, wherein said magnetic force lines generated by said first and second magnetic force line generators being shaped so that they do not intersect upper and lower walls of said vacuum vessel in the center of said plasma generation region.

9. A plasma generating apparatus according to claim 1, wherein at least one of said first arid second magnetic force line generating portions is overlapped with one end portion of the outer periphery side of the discharge electrode including the one end thereof.

10. A plasma generating apparatus according to claim 1, wherein a magnetic pole of said first magnetic force line generating portion on the plasma generation region side is opposite to a magnetic pole of said second magnetic force line generating portion on the plasma generation region side.

11. A substrate processing apparatus for subjecting a surface of a substrate of a solid device to a treatment, comprising:

a vacuum vessel having a plasma generation region established in an interior thereof;

a gas inductor that inducts discharge gas into said interior of said vacuum vessel;

an exhaust that exhausts an atmosphere in the interior of said vacuum vessel;

a tube-shaped discharge electrode fashioned so as to enclose said plasma generation region;

a first high-frequency electric power applicator that applies first high-frequency electric power to said discharge electrode;

a first magnetic force line generating portion positioned near one portion of an outer periphery side of said discharge electrode;

a second magnetic force line generating portion positioned near the other end portion of an outer periphery side of said discharge electrode; and a substrate stage on which the substrate is carried within said plasma generation region, wherein said first and second magnetic force line generating portions generate magnetic force lines having portions roughly parallel to the center axis of said discharge electrode, such that the length of said parallel portions becomes longer the closer said magnetic force lines are to said center axis, said magnetic force lines being capable of trapping electrons at least in a center of said plasma generation region.

12. A substrate processing apparatus for subjecting a surface of a substrate of a solid device to a treatment, comprising:

a vacuum vessel having a plasma generation region established in an interior thereof;

a substrate stage provided at a lower portion of said plasma generation region and having a substrate stage surface on which the substrate is carried within said plasma generation region, said substrate stage surface extending in a substantially horizontal direction;

a tube-shaped discharge electrode fashioned so as to enclose said plasma generation region and having a tube-shaped wall extending in a substantially vertical direction with respect to said substrate stage surface;

a first high-frequency electric power applicator that applies first high-frequency electric power to said discharge electrode;

a magnetic force line generating portion positioned at an outer periphery side of said discharge electrode;

an upper wall provided at an upper portion of said plasma generation region so as to oppose to said substrate stage;

a gas inductor that inducts discharge gas into said interior of said vacuum vessel; and an exhaust that exhausts an atmosphere in the interior of said vacuum vessels, wherein said magnetic force line generating portion generates magnetic force lines having portions roughly parallel to the center axis of said discharge electrode, such that the length of said parallel portions becomes longer the closer said magnetic force lines are to said center axis, said magnetic force lines being capable of trapping electrons at least in a center of said plasma generation region.

13. A substrate processing apparatus according to claim 12, further comprising:

a second high-frequency electric power applicator that applies second high-frequency electric power to said substrate stage, wherein said upper wall is directly coupled to a reference voltage.

14. A substrate processing apparatus according to claim 13, wherein said second high-frequency electric power applicator is a resonance circuit that applies high-frequency electric power to said substrate stage.

15. A substrate processing apparatus according to claim 12, wherein said gas inductor inducts discharge gas into said interior of said vacuum vessel through said upper wall, and said exhaust exhausts the atmosphere in the interior of said vacuum vessel from the level side of said substrate stage.

* * * * *